United States Patent
Otani et al.

Patent Number: 6,049,120
Date of Patent: Apr. 11, 2000

[54] THERMAL-STRESS-RESISTANT SEMICONDUCTOR SENSOR

[75] Inventors: Hiroshi Otani; Yasuo Yamaguchi; Masanori Tomioka, all of Tokyo, Japan

[73] Assignee: Mitsubishi Denki Kabushiki Kaisha, Tokyo, Japan

[21] Appl. No.: 08/869,770

[22] Filed: Jun. 5, 1997

[30] Foreign Application Priority Data

Jan. 14, 1997 [JP] Japan ................................. 9-004457

[51] Int. Cl.⁷ .................................................. H01L 23/495
[52] U.S. Cl. ........................ 257/667; 257/776; 257/670; 257/414
[58] Field of Search .................................. 257/414, 415, 257/416, 417, 418, 419, 420, 468, 666, 667, 668, 669, 688, 690, 787, 791, 676, 670; 483/50, 51, 54; 73/855, 727

[56] References Cited

U.S. PATENT DOCUMENTS

| | | | |
|---|---|---|---|
| 4,655,088 | 4/1987 | Adams ...................................... | 73/756 |
| 5,207,102 | 5/1993 | Talkahashi et al. ........................ | 73/727 |
| 5,227,663 | 7/1993 | Patil et al. ................................ | 257/718 |
| 5,604,372 | 2/1997 | Yamaguchi ............................... | 257/687 |
| 5,847,445 | 12/1998 | Wark et al. .............................. | 257/669 |

FOREIGN PATENT DOCUMENTS

| | | |
|---|---|---|
| 61-110023 | 5/1986 | Japan . |
| 61-140156 | 6/1986 | Japan . |
| 62-62234 | 4/1987 | Japan . |
| 03065627 | 3/1991 | Japan . |

*Primary Examiner*—Minh Loan Tran
*Assistant Examiner*—Luan Thai

[57] ABSTRACT

A semiconductor sensor is provided with a good temperature characteristic, the sensor being capable of preventing a pressure or acceleration detection characteristic from being affected by a change of the surrounding temperature. A semiconductor chip is provided approximately in the center of a die pad of a lead frame and detects a displacement amount corresponding to a pressure or an acceleration. The displacement amount is converted into an electric signal and output. A resin mold is formed so as to cover the semiconductor chip. A thermal-stress-relieving buffer ring is provided on the die pad so as to surround an external circumference of the semiconductor sensor chip thereby preventing stress caused by thermal expansion/contraction of the resin mold from being directly applied to the semiconductor chip from the side.

12 Claims, 3 Drawing Sheets

Fig. 1A  Bonding of the semiconductor sensor chip 1
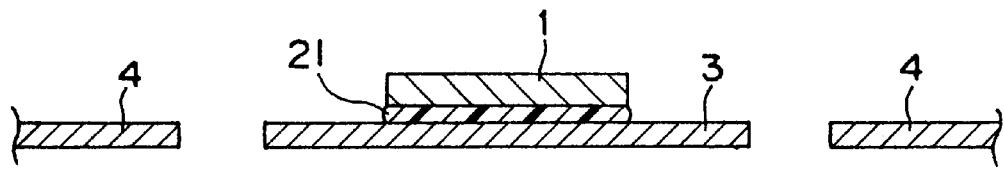
Fig. 1B  Bonding of the silicone resin ring
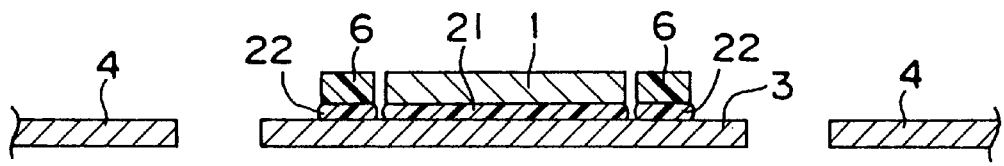
Fig. 1C  Wire bonding
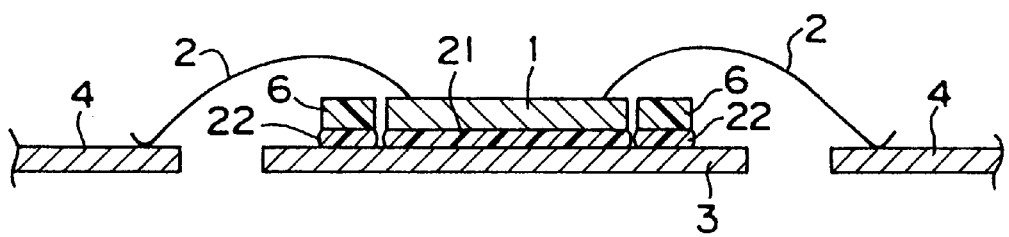
Fig. 1D  Molding
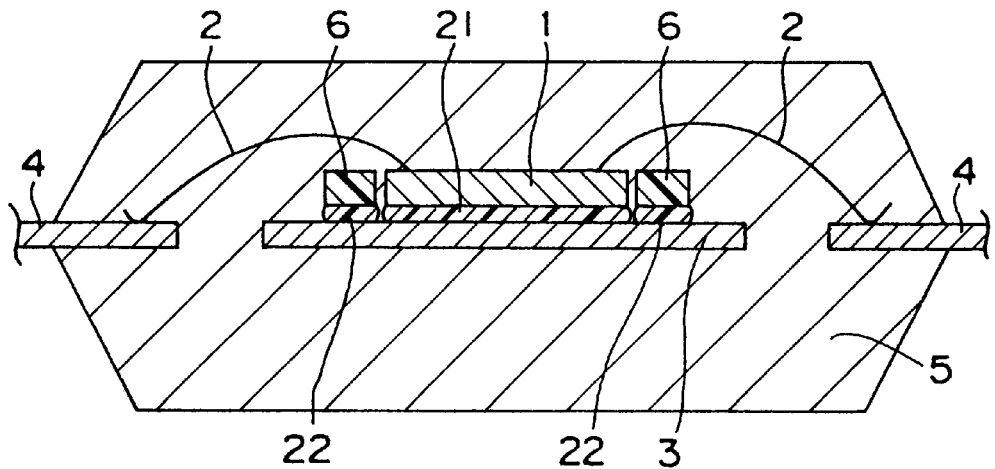

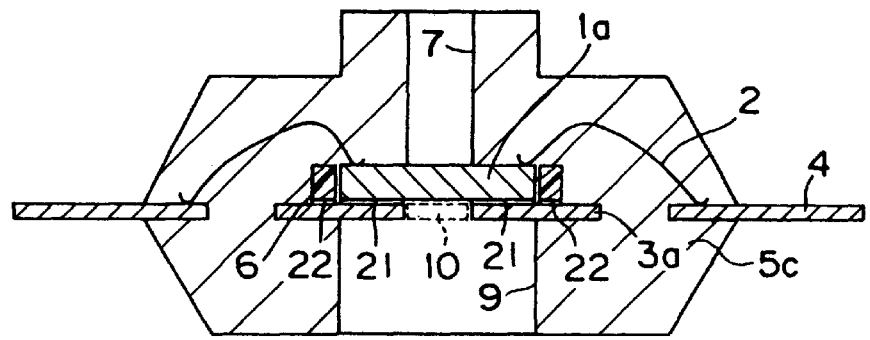
Fig. 5
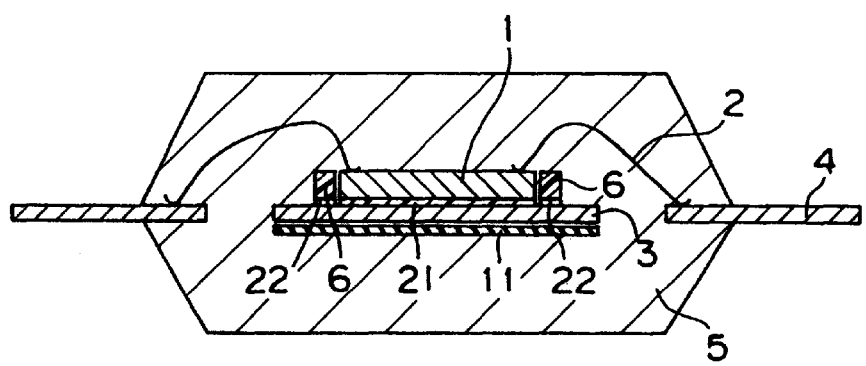
Fig. 6
Fig. 7 CONVENTIONAL ART
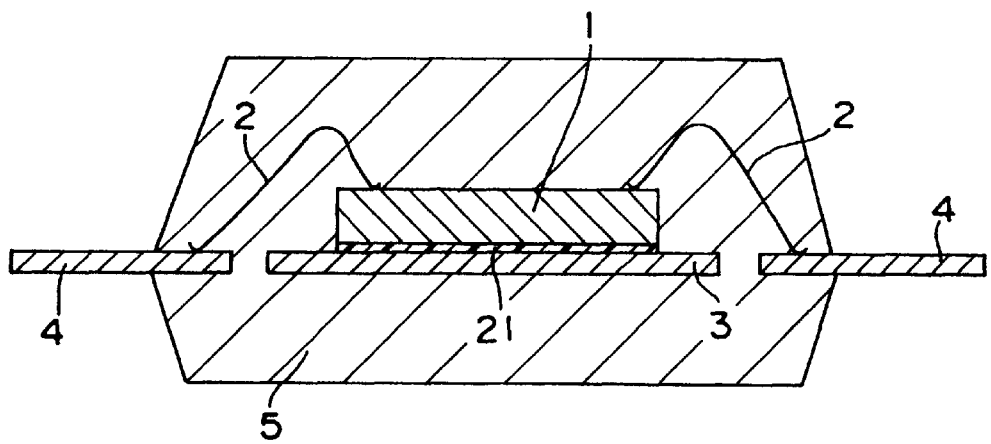

THERMAL-STRESS-RESISTANT SEMICONDUCTOR SENSOR

FIELD OF THE INVENTION

The present invention relates to a semiconductor sensor such as pressure sensor, acceleration sensor and the like.

BACKGROUND OF THE INVENTION

In recent years, various kinds of semiconductor sensors have come to be made on a semiconductor substrate due to advancement in technology for manufacturing IC's. FIG. 7 is a model view of a conventional semiconductor sensor for detecting an acceleration, the sensor being manufactured by means of a transfer mold molding. The semiconductor sensor shown in FIG. 7 can be manufactured by bonding a semiconductor sensor chip 1 on a die pad part 3 of a lead frame and connecting an electrode (not shown) on the semiconductor chip 1 to a lead part 4 on the lead frame with a bonding wire 2, followed by forming a resin mold 5 with the transfer mold molding. However, in the case of a semiconductor sensor for detecting a pressure instead of the acceleration, the semiconductor sensor is constituted by providing a hole for an external air pressure introduction in the resin mold 5 immediately on the semiconductor chip 5 in the structure of the semiconductor sensor shown in FIG. 7.

However, the conventional semiconductor sensor for detecting the conventional pressure or the acceleration has a problem in that since the semiconductor sensor chip 1 is directly coated with the resin mold 5, a thermal stress is generated between the resin mold 5 and the semiconductor sensor chip 1 owing to a difference in the thermal expansion coefficients between the semiconductor sensor chip 1 and the resin mold 5 upon the change of a peripheral temperature of the semiconductor sensor. Consequently, a stress other than the displacement caused by the pressure and the acceleration speed which are to be detected is added to the semiconductor chip. Therefore, the detection characteristic of the semiconductor sensor is deteriorated and the temperature characteristic is deteriorated.

SUMMARY OF THE INVENTION

An object of the present invention is to provide a semiconductor sensor with a good temperature characteristic, the sensor being capable of preventing the deterioration of the characteristic at the time of the change of the peripheral temperature changes.

It has been found that the above object can be attained by means of a structure which can alleviate a stress caused in the semiconductor chip as a result of the thermal shrinkage and expansion of the resin mold.

According to an aspect of the present invention there is provided a semiconductor sensor comprising:

a semiconductor chip provided approximately in the center of a die pad of a lead frame to detect a displacement amount corresponding to a pressure and an acceleration and to output the displacement amount by converting the displacement amount into an electric signal; and a resin mold molded so as to cover the semiconductor chip;

wherein a buffer material ring is provided on the die pad so as to surround the periphery of the semiconductor sensor chip, thereby preventing a stress caused by the thermal shrinkage (expansion) of the resin mold from being applied to the semiconductor chip from the side.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood by the accompanying drawings which are given by way of illustration only, and thus are not limitative of the present invention, and wherein:

FIGS. 1A to 1D are views schematically showing a semiconductor sensor according to embodiment 1 of the present invention in an order of the manufacturing process;

FIG. 5 is a model view showing a structure of the semiconductor sensor according to embodiment 4 of the present invention;

FIG. 6 is a model view showing a structure of the semiconductor sensor according to embodiment 5 of the present invention; and FIG. 7 is a model view showing the semiconductor sensor of the prior art.

DETAILED DESCRIPTION OF THE INVENTION

Figure 2:
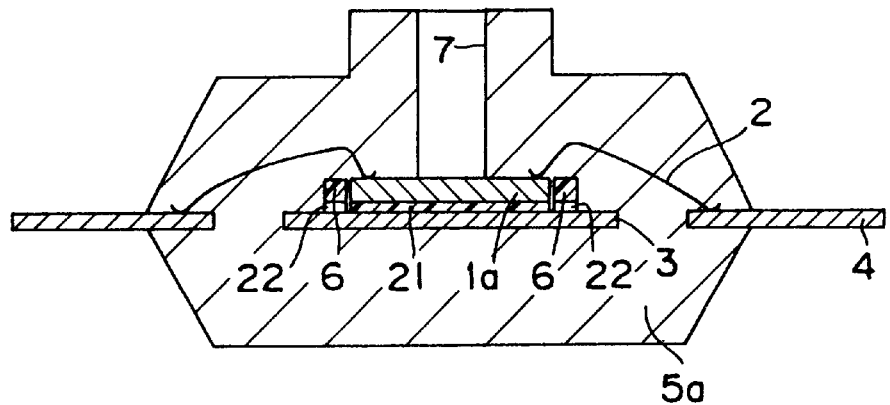
FIG. 2 is a model view showing a structure of the semiconductor sensor according to a modification of embodiment 1 shown in FIG. 1.

Furthermore, in the semiconductor sensor chip of the present invention, it is preferred that the surface of the aforementioned semiconductor sensor chip is coated with a resin for protecting the surface of the semiconductor sensor chip.

Furthermore, in the semiconductor sensor of the present invention, the aforementioned resin mold may be molded in such a manner that an open part is formed immediately below the aforementioned semiconductor sensor chip to alleviate the stress caused by the resin mold.

Furthermore, in the semiconductor sensor of the present invention, the semiconductor sensor can be further constituted which can detect the external air pressure relatively to the reference pressure by providing a hole for introducing external air pressure formed on the resin mold located immediately on the semiconductor chip, and a hole which is formed on a die pad whose surface is exposed with the open part, the hole serving to introduce air pressure which constitutes the reference pressure.

Furthermore, in the semiconductor sensor of the present invention, it is preferred that a buffer sheet is provided between the aforementioned die pad and the aforementioned resin mold.

Furthermore, in the semiconductor sensor of the present invention, it is further possible that the aforementioned die pad and the aforementioned semiconductor sensor chip are bonded with an adhesive which has a buffer function, and the adhesive is formed thickly so that a stress caused by the resin mold is prevented from being applied to the aforementioned semiconductor chip via the aforementioned die pad.

Furthermore, in the semiconductor sensor of the present invention, it is preferred that the aforementioned buffer material ring is formed of silicone resin.

As is apparent from what has been explained above, since the semiconductor device of the present invention is provided with a buffer material ring so as to surround an external circumference of the aforementioned semiconductor chip, the deterioration of the characteristic at the time of the surrounding temperature change can be prevented and the temperature characteristic can be made more favorable.

Furthermore, in the semiconductor chip of the present invention, since the surface of the aforementioned semiconductor chip is coated with resin for the buffer, a force can be prevented from being applied to the semiconductor sensor chip from above and the temperature characteristic can be made more favorable.

Furthermore, in the semiconductor sensor of the present invention, since the resin mold may be molded in such a manner that an open part is formed immediately below the aforementioned semiconductor sensor chip, a force can be prevented from being applied to the semiconductor sensor chip from below upon the resin mold being shrunken or expanded and the temperature characteristic can be made favorable.

Furthermore, in the semiconductor sensor of the present invention, since there is provided a hole for introducing external air pressure formed on the resin mold located immediately on the semiconductor chip; and a hole which is formed on a die pad whose surface is exposed with the open part, the hole serving to introduce air pressure which constitutes a reference pressure, a semiconductor sensor can be constituted which can compare the reference pressure with the external air pressure and can detect the external air pressure relatively with respect to the reference pressure.

Furthermore, in the semiconductor sensor, since a buffer sheet is provided between the aforementioned pad and the aforementioned resin mold, a force can be prevented from being applied to the semiconductor chip from below upon the expanded and the temperature characteristic can be made more favorable.

Furthermore, in the semiconductor sensor of the present invention, since the aforementioned die pad and the aforementioned semiconductor chip are bonded with an adhesive having a buffer function, and the adhesive is formed thickly, a force can be prevented from being applied to the semiconductor chip from below upon the resin mold being shrunken or expanded and the temperature characteristic can be made more favorable.

Furthermore, in the semiconductor sensor of the present invention, the temperature characteristic can be made favorable over a wide temperature range by constituting the aforementioned buffer material ring with the silicone resin.

PREFERRED EMBODIMENT OF THE INVENTION

Embodiments of the semiconductor sensor according to the present invention will be explained with reference to the accompanying drawings.

Embodiment 1

The semiconductor sensor according to the embodiment 1 is an acceleration sensor provided with a semiconductor sensor chip 1 for detecting an acceleration, the sensor being used for the vibration detection and acceleration control. The semiconductor sensor is manufactured through the process shown in FIG. 1. That is, as shown in FIG. 1A, the semiconductor sensor chip 1 is bonded onto the die pad 3 of the lead frame with an adhesive 21 followed by, as shown in FIG. 1B, bonding a ring-like silicone resin ring 6 formed of a silicone resin on the die pad around the semiconductor sensor chip 1 with an adhesive 22. The width of the silicone resin ring 6 may have a width of 10 $\mu$m or more to serve as a buffer material (for buffer function). However, to facilitate the handling thereof in the manufacturing process, it is preferred that the width of the resin ring is set to 30 $\mu$m or more. Furthermore, the thickness of the silicone resin ring 6 is set substantially the same as that of the semiconductor sensor chip 1. Furthermore, the silicone resin ring 6 may be provided so as to come into contact with the side of the semiconductor sensor chip 1. Otherwise, the silicone resin ring 6 may be provided with a slight gap from the side of the semiconductor sensor chip 1. Furthermore, as shown in FIG. 1C, after the electrode (not shown) on the semiconductor sensor chip 1 and the lead 4 of the lead frame are connected to each other with the bonding wire 2, followed by being molded with the resin mold 5 as shown in FIG. 1D, thereby manufacturing the semiconductor sensor according to embodiment 1.

Since the semiconductor sensor according to embodiment 1 which is constituted in the aforementioned manner is provided with the silicone resin ring 6 having a small vertical elastic coefficient and a small hardness around the semiconductor sensor chip 1, a force can be prevented from being applied directly to the semiconductor chip 1 when the resin mold 6 is shrunken or expanded by the temperature change with an excellent buffer action of the resin ring 6. Therefore, the deterioration of the detection characteristic of the semiconductor sensor can be prevented and the temperature characteristic thereof can be improved.

Furthermore, in the semiconductor sensor according to embodiment 1 which is constituted in the aforementioned manner, since the silicone resin ring 6 used as a buffer material has a buffer function over a wide temperature range, a semiconductor sensor which has a stable detection function over a wide range can be provided.

Furthermore, since the semiconductor sensor according to embodiment 1 of the present invention can prevent a molding pressure from being applied directly to the semiconductor sensor chip at the time of the molding in the manufacturing process, the semiconductor sensor with a stable quality can be manufactured and the yield in the manufacturing process can be improved.

As described above, in embodiment 1, the semiconductor sensor which is an acceleration sensor is constituted by using the semiconductor chip 1 which detects the acceleration. However, the present invention is not restricted thereto. As shown in FIG. 2, a semiconductor sensor 1 which is a pressure sensor may be constituted by using the semiconductor chip 1a which detects the pressure. In this case, the semiconductor sensor is constituted by using as the resin mold the resin mold 5a shown in FIG. 1 and having a pressure introduction hole 7 formed therein. In FIG. 2, like parts which is the same as the counterpart of FIG. 1 are denoted by like reference numerals. When the semiconductor sensor is constituted in the aforementioned manner, the same effect as embodiment 1 can be provided.

Embodiment 2

Figure 3:
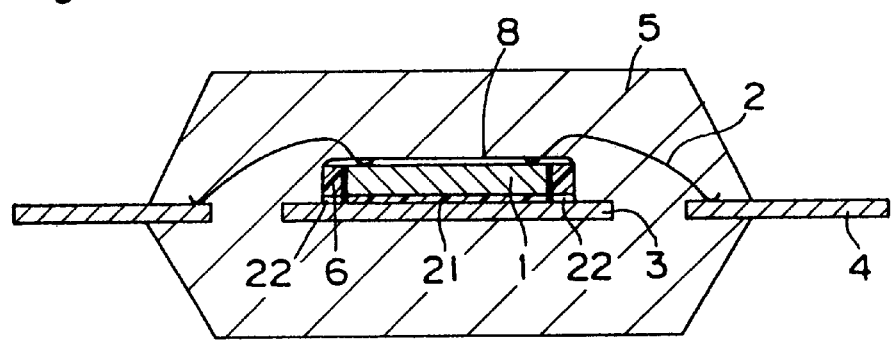
FIG. 3 is a model view showing a structure of the semiconductor sensor according to embodiment 2 of the present invention.

FIG. 3 is a model view showing a structure of the semiconductor sensor according to the embodiment 2 of the present invention. The semiconductor sensor according to the embodiment 2 is an acceleration sensor. In the semiconductor sensor according to the embodiment 2 shown in FIG. 3, the upper surface of the semiconductor sensor chip is coated with a silicone resin 8. Consequently, when the resin mold 5 is shrunken or expanded, the semiconductor sensor chip 1 can be protected and the detection characteristic can be further improved as compared with the embodiment 1. In the embodiment 2, too, the pressure sensor can be constituted by using the semiconductor sensor chip 1a for detecting pressure in the same manner as the embodiment 1.

Embodiment 3

Figure 4:
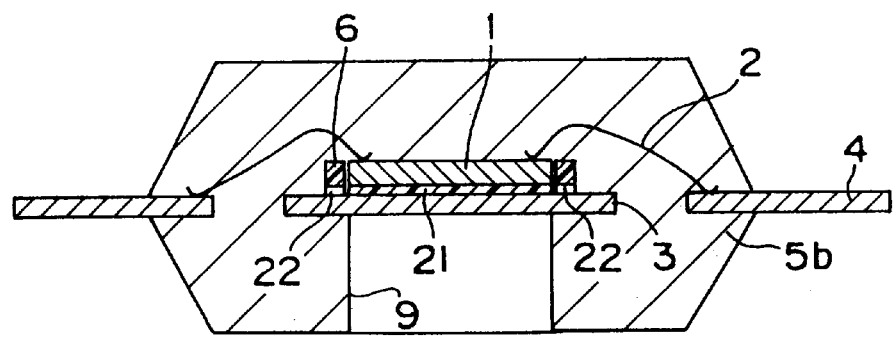
FIG. 4 is a model view showing a structure of the semiconductor sensor according to embodiment 3 of the present invention.

FIG. 4 is a model view showing a structure of a semiconductor sensor according to the embodiment 3 of the present invention. The semiconductor sensor according to the embodiment 3 is an acceleration sensor. In the semiconductor sensor according to the embodiment 3, there is provided an open part 9 wherein resin is removed at a part located opposite to the semiconductor chip 1 via the die pad 3 out of the resin mold 5b. As a consequence, when the resin mold 5b is shrunken or expanded, a force can be prevented from being applied from below to the semiconductor sensor chip 1. Therefore, the temperature characteristic can be made more favorable as compared with the embodiment 1. In the embodiment 3, a pressure sensor can be constituted by using a semiconductor sensor chip 1a for detecting a pressure.

Embodiment 4

The semiconductor sensor according to the embodiment 4 of the present invention shown in FIG. 5 is a pressure sensor of a gauge pressure type in which the semiconductor sensor chip 1a is used to form a pressure introduction hole 7 above the resin mold 5c, and an open part for pressure introduction is formed on a die pad. The pressure sensor of gauge pressure type refers to a pressure sensor which has two external air pressure introduction holes (open part 10 and pressure introduction hole 7 in FIG. 5) and which selects one of the pressures which is introduced via one hole and detects the other pressure relatively with respect to the former pressure. By constituting the semiconductor sensor of the present invention as described above, the embodiment 4 has the same effect as that of embodiment 3 and the pressure sensor of gauge pressure type can be easily constituted. Furthermore, in the embodiment 4 shown in FIG. 5, the pressure sensor of absolute pressure type can be provided by replacing the die pad 3a with a die pad 3 without said open part 10. Accordingly, the semiconductor sensor (pressure sensor) according to embodiment 4 can be applied both to an absolute pressure type, and a gauge pressure type only by replacing the lead frame. Consequently, an attempt can be made to use common parts so that the manufacturing cost can be eliminated.

Embodiment 5

The semiconductor sensor according to the embodiment 5 shown in FIG. 6 is provided with a rubber sheet such as a silicone between the die pad 4 and the resin mold 5. Consequently, a force can be alleviated which is caused by the shrinkage and expansion of the resin mold 5 and is applied sensor chip 1. As compared with the embodiment 1, the temperature characteristic can be made more favorable.

Embodiment 6

In the embodiment 6, an adhesive having a buffer function is used as the adhesive 21 and the thickness of the adhesive 21 is set to 10 μm or more, thereby preventing a force from being applied thereto from the lower surface of the semiconductor sensor chip 1. Thus, the temperature characteristic can be made more favorable as compared with embodiment 1 through 5. Incidentally, it is preferred that the thickness of the adhesive is set to 500 μm or less in consideration of the control aspect or the like in the manufacturing process.

Modification

In the aforementioned embodiments 1 to 6, a silicone resin is used as a material for a buffer material ring. However, the present invention is not restricted thereto, and any other materials may be used as long as the material has a small vertical elastic coefficient (100 kgf/mm$^2$ or less). For example, there can be used materials such as fluorinated rubber, elastomer, Teflon and the like.

What is claimed is:

1. A semiconductor sensor comprising:
   a lead frame having a die pad;
   a semiconductor chip mounted approximately in the center of said die-pad to detect an amount of deformation corresponding to a pressure or acceleration applied thereto and to convert the detected deformation amount into an electric signal output;
   a bonding wire connecting said semiconductor chin to said die-pad;
   a resin mold molded so as to cover said semiconductor chip;
   a thermal-stress-relieving buffer ring mounted on said die-pad so as to surround the periphery of said semiconductor chip;
   a thickness of said thermal-stress-relieving buffer ring being set substantially the same as a thickness of said semiconductor chip;
   said thermal-stress-relieving buffer ring preventing stress caused by a thermal shrinkage or expansion of said resin mold from being directly applied to said semiconductor chip from the side.

2. The semiconductor sensor according to claim 1, said semiconductor chip is provided with a protecting resin coating at a surface thereof.

3. The semiconductor sensor according to claim 1, said resin mold is provided with an open part just below the semiconductor chip.

4. The semiconductor sensor for detecting an outside pressure according to claim 3,
   said resin mold including a first hole for introducing external air pressure located just above the semiconductor chip; and
   said die pad including a second hole formed on said die pad whose surface is exposed with said open part just below the semiconductor chip, the second hole serving to introduce air pressure for a reference pressure.

5. The semiconductor sensor according to claim 1, wherein a buffer sheet is positioned between a surface of said die pad opposite to said semiconductor chip and said resin mold.

6. The semiconductor sensor according to claim 1, wherein the die pad the semiconductor sensor chip are bonded with an adhesive having buffer function, and the adhesive has a thickness so as to prevent a stress caused by the resin mold from being applied to the semiconductor chip through said die pad.

7. The semiconductor sensor according to claim 1, wherein said buffer material ring is formed of a silicone resin.

8. The semiconductor sensor according to claim 1, said thermal-stress-relieving buffer ring having an elastic coefficient small enough to prevent thermal expansion/contraction of said resin mold from being directly applied to said semiconductor chip.

9. The semiconductor sensor according to claim 8, said thermal-stress-relieving buffer ring having an elastic coefficient less than about 100 kgf/mm$^2$ to prevent thermal expansion/contraction of said resin mold from being directly applied to said semiconductor chip.

10. The semiconductor sensor according to claim 1, further comprising:

a first hole for introducing external air pressure formed on said resin mold located just above said semiconductor chip.

11. The semiconductor sensor according to claim 1, said thermal-stress-relieving buffer ring having a width greater than about 30 $\mu$m.

12. The semiconductor sensor according to claimn 1, further comprising:

an adhesive bonding said semiconductor chip to said die pad, said adhesive having a thickness t such that 10 $\mu$m $\leq$ t $\leq$ 500 $\mu$m.

* * * * *